United States Patent [19]
Corisis

[11] Patent Number: 5,889,318
[45] Date of Patent: Mar. 30, 1999

[54] LEAD FRAME INCLUDING ANGLE IRON TIE BAR AND METHOD OF MAKING THE SAME

[75] Inventor: David J. Corisis, Meridian, Id.

[73] Assignee: Micron Technology, Inc., Boise, Id.

[21] Appl. No.: 909,931

[22] Filed: Aug. 12, 1997

[51] Int. Cl.$^6$ ............................ H01L 23/495; H05K 7/02; H05K 7/04
[52] U.S. Cl. ............................ 257/670; 257/666; 438/123; 361/813
[58] Field of Search ............................ 257/670, 666; 438/123; 361/813

[56] References Cited

U.S. PATENT DOCUMENTS

| | | | |
|---|---|---|---|
| 5,150,194 | 9/1992 | Brooks et al. | 357/70 |
| 5,197,183 | 3/1993 | Chia et al. | 29/827 |
| 5,446,959 | 9/1995 | Kim et al. | 29/827 |
| 5,612,853 | 3/1997 | Kim et al. | 361/723 |

*Primary Examiner*—Mahshid Saadat
*Assistant Examiner*—Jhihan B. Clark
*Attorney, Agent, or Firm*—Killworth, Gottman, Hagan & Schaeff, L.L.P.

[57] ABSTRACT

A lead frame and method of making the same are provided. The lead frame includes a die mounting portion, first and second pairs of tie bars, and first and second tie bar bridges extending between respective second extension portions of each tie bar pair. First and second pairs of tie bars are mechanically coupled to respective first and second ends of the die mounting portion. Each of the tie bars includes a first extension portion, a second extension portion, a tie bar span mechanically coupled to the first end of the die mounting portion via the first extension portion, a tie bar flap formed along a longitudinal reinforcement crease, and a lateral reinforcement portion extending from said first extension portion to said die mounting portion. The tie bar flap and the tie bar span lie in intersecting planes and are connected along the longitudinal reinforcement crease between the first extension portion and the second extension portion. The lateral reinforcement portion extends in a direction perpendicular to a direction of said longitudinal reinforcement crease. A first tie bar bridge extends between respective second extension portions of a first tie bar of the first pair of tie bars and a second tie bar of the first pair of tie bars. A second tie bar bridge extends between respective second extension portions of a first tie bar of the second pair of tie bars and a second tie bar of the second pair of tie bars.

23 Claims, 2 Drawing Sheets

LEAD FRAME INCLUDING ANGLE IRON TIE BAR AND METHOD OF MAKING THE SAME

BACKGROUND OF THE INVENTION

The present invention relates to fabrication technology used in the assembly of integrated circuit packages and, more particularly, to the design of a lead frame for an encapsulated integrated circuit.

According to conventional integrated circuit manufacture, the lead frame, and, in particular, the tie bars of the lead frame, often bows or becomes distorted during the die attachment and encapsulation process. The result is an improper spatial relationship of the die attach pad relative to the integrated circuit package. Such displacement causes mechanical and electrical failure within the integrated circuit package and results in loss of system integrity and quality.

Accordingly, a need exists for a lead frame design that effectively reduces bowing and distortion of the lead frame during integrated circuit packaging operations.

BRIEF SUMMARY OF THE INVENTION

This need is met by the present invention wherein a lead frame is provided and includes an angle iron tie bar with lateral reinforcement portions.

In accordance with one embodiment of the present invention, a lead frame is provided comprising a die mounting portion and at least one tie bar mechanically coupled to the die mounting portion. The tie bar includes a longitudinal reinforcement crease defined along at least a portion of the tie bar and a tie bar flap formed along the reinforcement crease. The lead frame may further comprise electrically conductive leads mechanically coupled to the tie bar. The tie bar may further comprises a tie bar span defined by the longitudinal reinforcement crease. The tie bar flap may be substantially planar. The tie bar flap and the tie bar span are preferably offset by an angle selected so as to enable closely packed lead frame stacking, e.g., less than 90°. The die mounting portion and the tie bar preferably form a one-piece, integrally constructed, lead frame.

In accordance with another embodiment of the present invention, a lead frame is provided comprising a die paddle and an angle iron tie bar mechanically coupled to the die paddle. The angle iron tie bar is preferably characterized by a bend angle of less than 90°. The angle iron tie bar preferably includes an extension portion, a tie bar span defined by a longitudinal reinforcement crease, and a tie bar flap formed along the reinforcement crease. The tie bar span may be mechanically coupled to the die paddle via the extension portion.

In accordance with yet another embodiment of the present invention, a lead frame is provided comprising a die mounting portion and at least one tie bar. The tie bar includes a tie bar span mechanically coupled to the die mounting portion and a substantially planar tie bar flap connected to the tie bar span. The tie bar span and the tie bar flap may lie in intersecting planes. The angle iron tie bar may include an extension portion and the tie bar span may be mechanically coupled to the die paddle via the extension portion. The tie bar flap and the tie bar span may be connected along a longitudinal reinforcement crease formed by a bend in the lead frame.

In accordance with yet another embodiment of the present invention, a lead frame is provided comprising a die mounting portion and at least one tie bar mechanically coupled to the die mounting portion. The tie bar includes a longitudinal reinforcement crease defined along at least a portion of the tie bar. The tie bar includes a tie bar span and a tie bar flap and the reinforcement crease is formed by bending the tie bar flap relative to the tie bar span.

In accordance with yet another embodiment of the present invention, a lead frame is provided comprising a die mounting portion and at least one tie bar mechanically coupled to the die mounting portion. The at least one tie bar includes a longitudinal reinforcement crease defined along at least a portion of the tie bar, a tie bar flap formed along the reinforcement crease, and a lateral reinforcement portion extending from the tie bar to the die mounting portion. The lateral reinforcement portion extends in a direction perpendicular to a direction of the longitudinal reinforcement crease and may comprise a chamfered span.

In accordance with yet another embodiment of the present invention, a method of forming a lead frame is provided comprising the steps of: providing a die mounting portion and at least one tie bar, wherein the tie bar includes a tie bar span mechanically coupled to the die mounting portion; and bending a portion of the tie bar span along a longitudinal reinforcement crease defined along at least a portion of the tie bar so as to form a tie bar flap connected to the tie bar span along the reinforcement crease.

In accordance with yet another embodiment of the present invention, a method of forming a lead frame is provided comprising the steps of: providing a die mounting portion and at least one tie bar, wherein the tie bar is mechanically coupled to the die mounting portion; and forming a longitudinal reinforcement crease along at least a portion of the tie bar.

In accordance with yet another embodiment of the present invention, a method of forming a lead frame is provided comprising the steps of: providing a die mounting portion and at least one tie bar, wherein the tie bar includes a longitudinal tie bar span mechanically coupled to the die mounting portion; and connecting a tie bar flap to the tie bar span.

In accordance with yet another embodiment of the present invention, a mounted die arrangement is provided comprising a lead frame and an integrated circuit die. The lead frame includes a lead frame body including a plurality of electrically conductive leads, a die mounting portion, and at least one tie bar extending from the lead frame body to the die mounting portion, wherein the at least one tie bar includes a longitudinal reinforcement crease defined along at least a portion of the tie bar and a tie bar flap formed along the reinforcement crease. The integrated circuit die is mounted on the die mounting portion and includes electrical connections conductively coupled to the electrically conductive leads. The integrated circuit die may be characterized by physical characteristics indicative of formation from a wafer including a plurality of similar integrated circuit dies.

In accordance with yet another embodiment of the present invention, an encapsulated integrated circuit is provided comprising: a plurality of electrically conductive leads; a die mounting portion; an integrated circuit die, at least one tie bar, and an encapsulating material. The integrated circuit die is mounted on the die mounting portion and includes electrical connections conductively coupled to the electrically conductive leads. The tie bar is mechanically coupled to the die mounting portion and includes a longitudinal reinforcement crease defined along at least a portion of the tie bar and a tie bar flap formed along the reinforcement crease. The encapsulating material surrounds the tie bar, the integrated circuit die, and portions of the electrically conductive leads to form a solid state encapsulated integrated circuit.

In accordance with yet another embodiment of the present invention, a method ITS of encapsulating an integrated circuit is provided comprising the steps of: providing a plurality of electrically conductive leads, a die mounting portion, and at least one tie bar mechanically coupled to the die mounting portion; mounting an integrated circuit die on the die mounting portion, the integrated circuit die including electrical connections; conductively coupling the electrically conductive leads to the electrical connection; reinforcing the tie bar by forming a longitudinal reinforcement crease along at least a portion of the tie bar; and encapsulating the integrated circuit die, at least a portion of the tie bar, and portions of the electrically conductive leads. The tie bar may include a tie bar flap and a tie bar span and the longitudinal reinforcement crease may be formed by bending a tie bar flap relative to a tie bar span along the longitudinal reinforcement crease.

In accordance with yet another embodiment of the present invention, a lead frame is provided comprising a die mounting portion, first and second pairs of tie bars, and first and second tie bar bridges extending between respective second extension portions of the tie bar pairs. Each of the tie bars includes a first extension portion, a second extension portion, a tie bar span mechanically coupled to the first end of the die mounting portion via the first extension portion, a tie bar flap formed along a longitudinal reinforcement crease, wherein the tie bar flap and the tie bar span lie in intersecting planes and are connected along the longitudinal reinforcement crease between the first extension portion and the second extension portion. A lateral reinforcement portion extends from the first extension portion to the die mounting portion in a direction perpendicular to a direction of the longitudinal reinforcement crease.

Accordingly, it is an object of the present invention to provide a lead frame resistant to bowing and distortion during integrated circuit encapsulation.

DETAILED DESCRIPTION OF THE PREFERRED EMBODIMENTS

Figure 1:
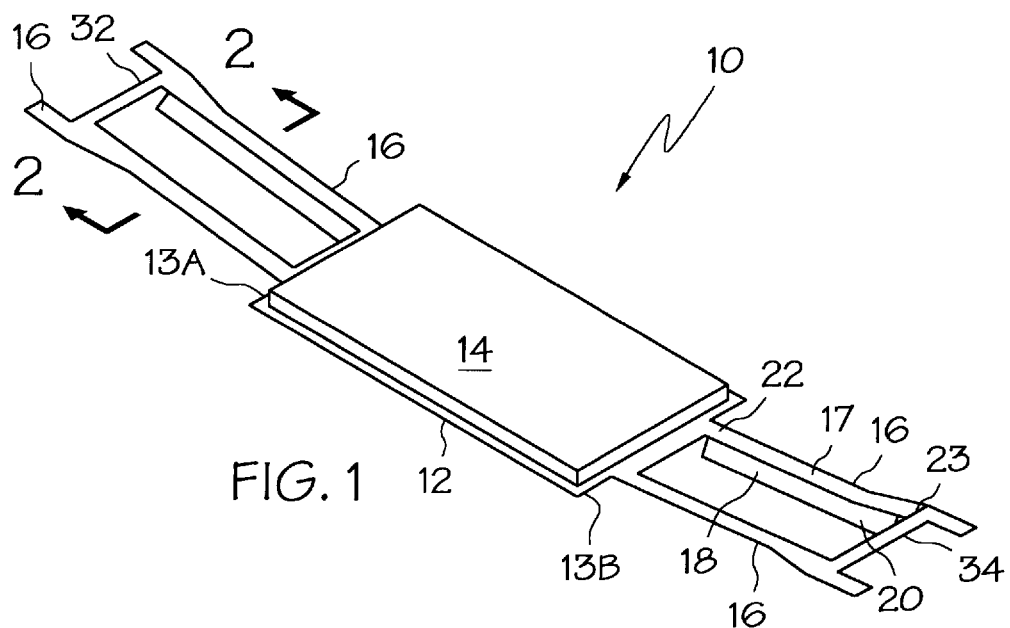
FIG. 1 is an isometric illustration of a lead frame including angle iron tie bar according to present invention.
Figure 2:
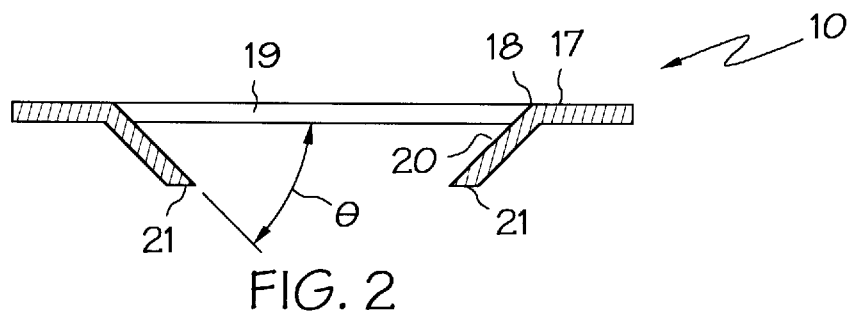
FIG. 2 is a cross sectional view of a portion of an angle iron tie bar taken along line 2—2 in FIG.

Referring to FIGS. 1 and 2, where like structure is represented by like reference numerals, a lead frame 10 according to the present invention is illustrated in detail. The lead frame 10 comprises a die mounting portion or die paddle 12 having a first end 13A and a second end 13B opposite the first end 13A. The lead frame 10 also comprises first and second pairs of angle iron tie bars 16 mechanically coupled to the die mounting portion 12. Specifically, a first pair of tie bars 16 is mechanically coupled to the first end 13A of the die mounting portion 12, and a second pair of tie bars 16 is mechanically coupled to the second end of the die mounting portion 12. An integrated circuit die 14 is mounted on the die mounting portion 12 to define a mounted die arrangement.

Each tie bar 16 includes a first extension portion 22, a second extension portion 23, and a tie bar span 17 which is mechanically coupled to respective first and second ends 13A, 13B of the die mounting portion 12 via the first extension portion 22. The tie bar span 17 is defined by a longitudinal reinforcement crease 18. The longitudinal reinforcement crease 18 is defined along at least a portion of the tie bar 16. The tie bar 16 further includes a substantially planar tie bar flap 20 formed along the reinforcement crease 18 and connected to the tie bar span 17 between the first extension portion 22 and the second extension portion 23. The tie bar span 17 and the tie bar flap 20 lie in intersecting planes. Preferably, the die mounting portion 12 and the tie bars 16 form a one-piece, integrally constructed, lead frame 10. A first tie bar bridge 32 extends between respective second extension portions 23 of a first pair of tie bars 16. Similarly, a second tie bar bridge 34 extends between respective second extension portions of the second pair of tie bars 16.

Preferably, the tie bar flap 20 and the corresponding tie bar span 17 and longitudinal reinforcement crease 18 are formed by a bend in the lead frame 10. Specifically, the reinforcement crease 18 is formed by bending the tie bar flap 20 relative to the tie bar span 17. It is contemplated by the present invention, however, that the tie bar flap 20 and the tie bar span 17 may be provided in a manner other than bending. For example, the tie bar flap 20 may be welded to the tie bar span 17. Further, it is contemplated by the present invention that the tie bar flap 20 may be connected to the tie bar span 17 at a location other than the edge of the tie bar span 17.

Each tie bar flap 20 and corresponding tie bar span 17 are preferably offset by a bend angle $\theta$ of less than 90° to enable closely packed stacking of a plurality of lead frames 10, see FIG. 2. Specifically, closely packed stacking is achievable at bend angles $\theta$ less than 90° because the base edges 21 of the tie bar flaps 20 fit within the tie bar separation space 19 when a lead frame 10 is stacked upon another lead frame 10. At bend angles close to or above 90°, the base edges 21 of the tie bar flaps 20 abut the tie bar span 17 of the other lead frame 10 and closely packed spacing is not achievable without thick and expensive lead frame separation material.

Figure 4:
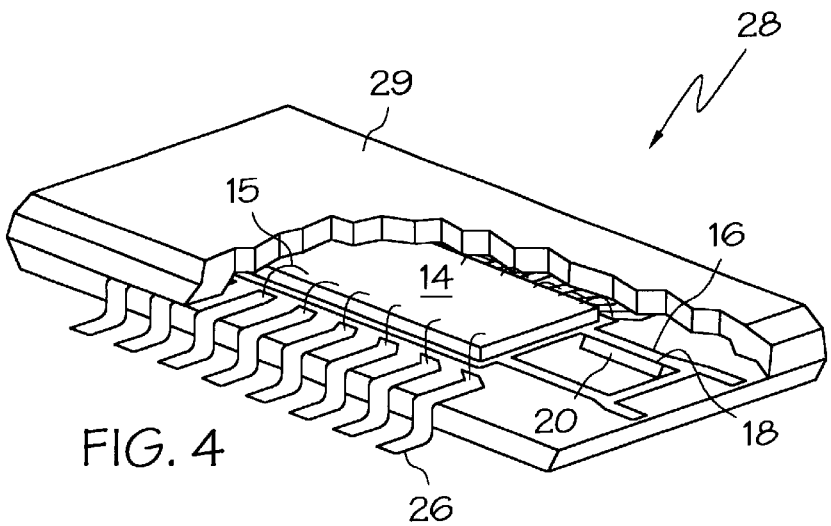
FIG. 4 is an isometric view, partially broken away, of an encapsulated integrated circuit incorporating an angle iron tie bar according to the present invention.
Figure 5:
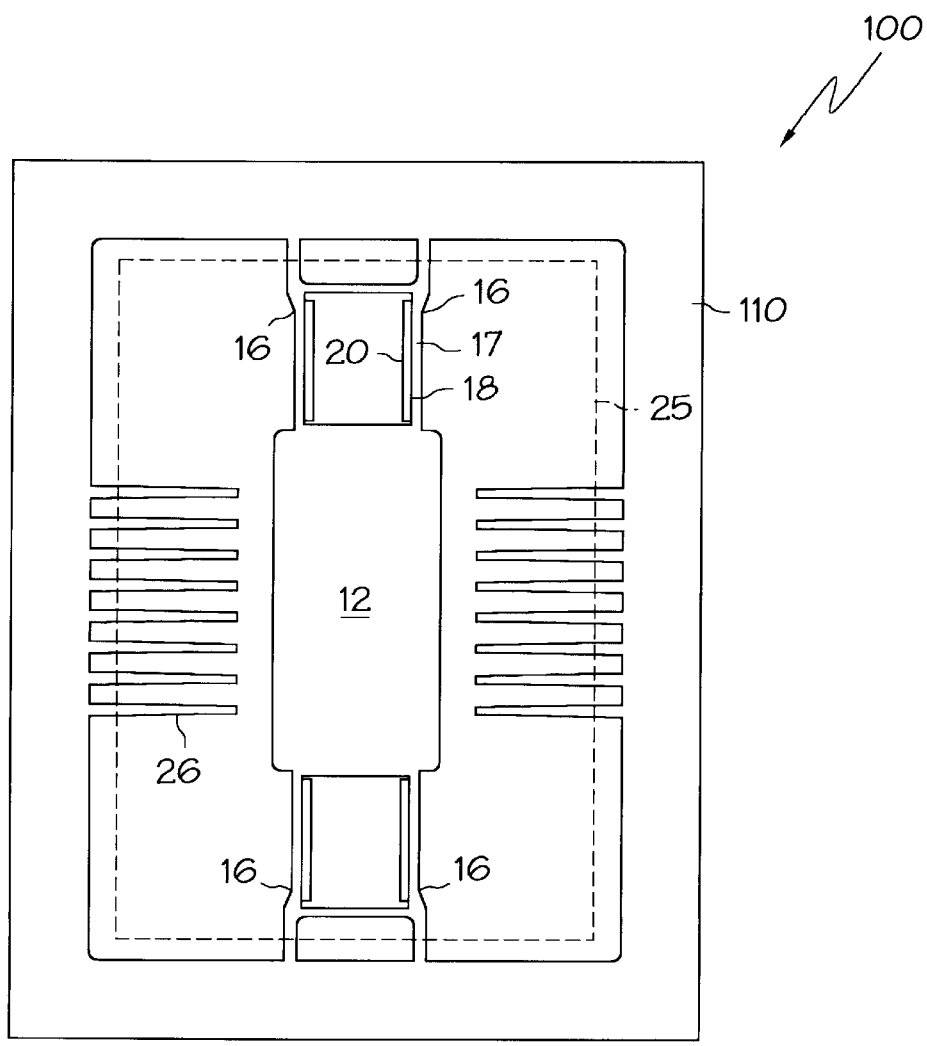
FIG. 5 is a plan view of a lead frame including an angle iron tie bar according to the present invention.

Referring to FIGS. 4 and 5, a lead frame 100 comprises a lead frame body 110 including a plurality of electrically conductive leads 26, the die mounting portion 12, and the tie bars 16. The integrated circuit die 14 includes electrical connections 15 conductively coupled to the leads 26. Each tie bar 16 extends from the lead frame body 110 to the die mounting portion 12. As is noted above with reference to FIGS. 1 and 2, each tie bar 16 includes the longitudinal reinforcement crease 18 defined along at least a portion of the tie bar 16 and a tie bar flap 20 formed along the reinforcement crease 18. The leads 26 are mechanically coupled to the tie bar 16 via the lead frame body 110.

Portions of the lead frame body 110 are removed, as indicated by the hatched line 25, after encapsulation of the lead frame 100 and the die 14. An encapsulated integrated circuit 28 is illustrated in FIG. 4 and comprises an encapsulating material 29 surrounding the tie bars 16, the integrated circuit die 14, and portions of the electrically conductive leads 26. The encapsulating material 29 physically binds the integrated circuit die 14 and forms a solid state encapsulated integrated circuit 28.

For the purposes of describing and defining the present invention, it should be appreciated that the integrated circuit die 14 typically comprises a patterned-substrate integrated circuit cut from a semiconductor wafer including a plurality of similar integrated circuits. However, it should also be appreciated that an integrated circuit die, as utilized herein, is not limited to integrated circuits formed from a wafer of dies. Rather, the integrated circuit die 14 comprises an integrated circuit formed on a substrate. It is contemplated by the present invention that a "lead frame," as referred to in the present description and claims, does not necessarily incorporate electrically conductive leads. Rather, the lead frame according to the present invention may merely serve to support a die or a die paddle mechanically.

Figure 3:
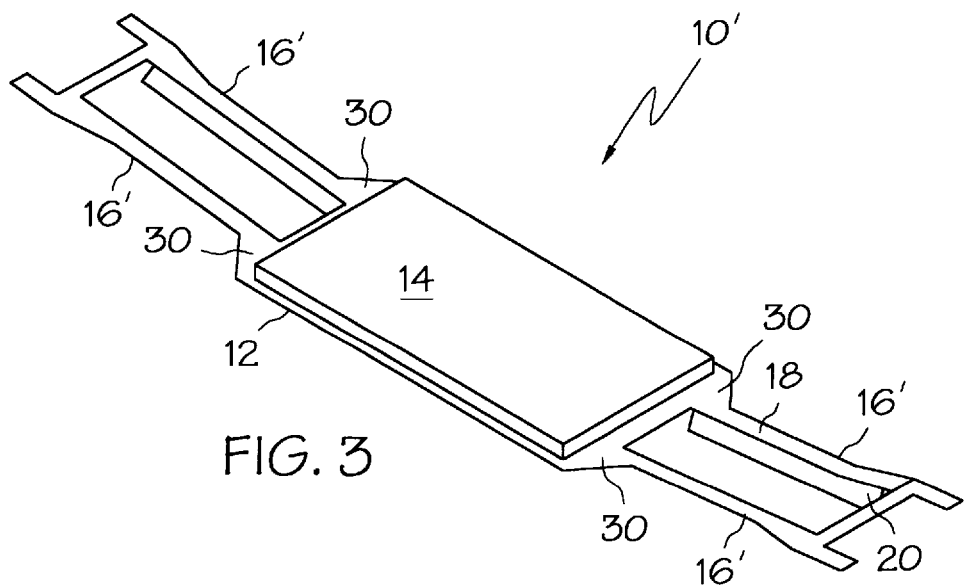
FIG. 3 is an isometric illustration of an angle iron tie bar provided with lateral reinforcement portions according to the present invention.

Referring now to FIG. 3, an alternative embodiment of the present invention, including an angle iron tie bar 10' provided with lateral reinforcement portions 30, is illustrated. The lead frame 10' comprises the die mounting portion or die paddle 12 and respective pairs of tie bars 16' mechanically coupled to opposite ends of the die mounting portion 12. Each tie bar 16' includes the longitudinal reinforcement crease 18 and the tie bar flap 20. In addition, lateral reinforcement portions 30 extend from the each tie bar 16' to the die mounting portion 12 in a direction perpendicular to a direction of the longitudinal reinforcement crease 18. The lateral reinforcement portion 30 comprises a chamfered span, i.e., a lead frame portion bounded by a diagonal projection from the tie bar 16 to the die mounting portion 12. The lateral reinforcement portion 30 is operative further to reduce bowing and distortion of the tie bar 16 during encapsulation.

Having described the invention in detail and by reference to preferred embodiments thereof, it will be apparent that modifications and variations are possible without departing from the scope of the invention defined in the appended claims.

What is claimed is:

1. A lead frame comprising:

a die mounting portion; and at least one tie bar mechanically coupled to said die mounting portion, wherein said at least one tie bar includes a longitudinal reinforcement crease defined along at least a portion of said tie bar and a tie bar flap formed along said reinforcement crease.

2. A lead frame as claimed in claim 1 wherein said lead frame further comprises electrically conductive leads mechanically coupled to said tie bar.

3. A lead frame as claimed in claim 1 wherein said lead frame further comprises electrically conductive leads.

4. A lead frame as claimed in claim 1 wherein said tie bar further comprises a tie bar span defined by said longitudinal reinforcement crease.

5. A lead frame as claimed in claim 1 wherein said tie bar flap is substantially planar.

6. A lead frame as claimed in claim 1 wherein said tie bar further comprises a tie bar span and wherein said tie bar flap and said tie bar span are offset by an angle of less than 90°.

7. A lead frame as claimed in claim 1 wherein said tie bar further comprises a tie bar span and wherein said tie bar flap and said tie bar span are offset by an angle selected so as to enable closely packed lead frame stacking.

8. A lead frame as claimed in claim 1 wherein said die mounting portion and said tie bar form a one-piece, integrally constructed, lead frame.

9. A lead frame comprising:

a die mounting portion; and at least one tie bar including a tie bar span mechanically coupled to said die mounting portion and a substantially planar tie bar flap connected to said tie bar span, wherein said tie bar span and said tie bar flap lie in intersecting planes.

10. A lead frame as claimed in claim 9 wherein said angle iron tie bar includes an extension portion wherein said tie bar span is mechanically coupled to said die paddle via said extension portion.

11. A lead frame as claimed in claim 10 wherein said tie bar flap and said tie bar span are connected along a longitudinal reinforcement crease formed by a bend in said lead frame.

12. A lead frame as claimed in claim 11 wherein said bend is characterized by a bend angle of less than 90°.

13. A lead frame comprising:

a die mounting portion; and at least one tie bar mechanically coupled to said die mounting portion, wherein said at least one tie bar includes a longitudinal reinforcement crease defined along at least a portion of said tie bar.

14. A lead frame as claimed in claim 13 wherein said tie bar includes a tie bar span and a tie bar flap and wherein said reinforcement crease is formed by bending said tie bar flap relative to said tie bar span.

15. A lead frame comprising:

a die mounting portion; and at least one tie bar mechanically coupled to said die mounting portion, wherein said at least one tie bar includes a longitudinal reinforcement crease defined along at least a portion of said tie bar, a tie bar flap formed along said reinforcement crease, and a lateral reinforcement portion extending from said tie bar to said die mounting portion, wherein said lateral reinforcement portion extends in a direction perpendicular to a direction of said longitudinal reinforcement crease.

16. A lead frame as claimed in claim 15 wherein said lateral reinforcement portion comprises a chamfered span.

17. A lead frame as claimed in claim 15 wherein said die mounting portion and said tie bar form a one-piece, integrally constructed, lead frame.

18. A mounted die arrangement comprising:

a lead frame including a lead frame body including a plurality of electrically conductive leads, a die mounting portion, and at least one tie bar extending from said lead frame body to said die mounting portion, wherein said at least one tie bar includes a longitudinal reinforcement crease defined along at least a portion of said tie bar and a tie bar flap formed along said reinforcement crease; and an integrated circuit die mounted on said die mounting portion, said integrated circuit die including electrical connections conductively coupled to said electrically conductive leads.

19. A mounted die arrangement as claimed in claim 18 wherein said integrated circuit die is characterized by physical characteristics indicative of formation from a wafer including a plurality of similar integrated circuit dies.

20. An encapsulated integrated circuit comprising:
a plurality of electrically conductive leads;
a die mounting portion;
an integrated circuit die mounted on said die mounting portion, said integrated circuit die including electrical connections conductively coupled to said electrically conductive leads;
at least one tie bar mechanically coupled to said die mounting portion, wherein said at least one tie bar includes a longitudinal reinforcement crease defined along at least a portion of said tie bar and a tie bar flap formed along said reinforcement crease; and
an encapsulating material surrounding said at least one tie bar, said integrated circuit die, and portions of said electrically conductive leads.

21. An encapsulated integrated circuit as claimed in claim 20 wherein said encapsulating material forms a solid state encapsulated integrated circuit.

22. An encapsulated integrated circuit as claimed in claim 20 wherein said encapsulating material physically binds said integrated circuit die.

23. A lead frame comprising:
a die mounting portion having a first end and a second end opposite said first end;
a first pair of tie bars mechanically coupled to said first end of said die mounting portion, and a second pair of tie bars mechanically coupled to said second end of said die mounting portion, wherein each of said tie bars includes
a first extension portion,
a second extension portion,
a tie bar span mechanically coupled to said first end of said die mounting portion via said first extension portion,
a tie bar flap formed along a longitudinal reinforcement crease, wherein said tie bar flap and said tie bar span lie in intersecting planes and are connected along said longitudinal reinforcement crease between said first extension portion and said second extension portion,
a lateral reinforcement portion extending from said first extension portion to said die mounting portion, wherein said lateral reinforcement portion extends in a direction perpendicular to a direction of said longitudinal reinforcement crease;
a first tie bar bridge extending between respective second extension portions of a first tie bar of said first pair of tie bars and a second tie bar of said first pair of tie bars; and
a second tie bar bridge extending between respective second extension portions of a first tie bar of said second pair of tie bars and a second tie bar of said second pair of tie bars.

* * * * *